(12) United States Patent
Kim et al.

(10) Patent No.: US 10,658,563 B2
(45) Date of Patent: May 19, 2020

(54) ULTRASOUND TRANSDUCER AND MANUFACTURING METHOD THEREOF

(71) Applicant: Siemens Medical Solutions USA, Inc., Malvern, PA (US)

(72) Inventors: DuYeop Kim, Gyeongsangbuk-do (KR); KyungHo Lee, Pohang-si (KR); SeungHee Lee, Gyeongbuk (KR)

(73) Assignee: Siemens Medical Solutions USA, Inc., Malvern, PA (US)

( * ) Notice: Subject to any disclaimer, the term of this patent is extended or adjusted under 35 U.S.C. 154(b) by 329 days.

(21) Appl. No.: 15/643,226

(22) Filed: Jul. 6, 2017

(65) Prior Publication Data

US 2018/0033945 A1 Feb. 1, 2018

(30) Foreign Application Priority Data

Jul. 26, 2016 (KR) .............................. 2016-0094961

(51) Int. Cl.
| | | |
|---|---|---|
| *B06B 1/06* | (2006.01) | |
| *H01L 41/04* | (2006.01) | |
| *H01L 41/047* | (2006.01) | |
| *B06B 1/02* | (2006.01) | |
| *H01L 41/053* | (2006.01) | |
| *H01L 41/293* | (2013.01) | |
| *H01L 41/31* | (2013.01) | |

(52) U.S. Cl.
CPC .......... *H01L 41/047* (2013.01); *B06B 1/0215* (2013.01); *B06B 1/0644* (2013.01); *B06B 1/0685* (2013.01); *H01L 41/0475* (2013.01); *H01L 41/053* (2013.01); *H01L 41/293* (2013.01); *H01L 41/31* (2013.01); *B06B 2201/20* (2013.01)

(58) Field of Classification Search
CPC . H01L 41/047; H01L 41/053; H01L 41/0475; B06B 1/0644
See application file for complete search history.

(56) References Cited

U.S. PATENT DOCUMENTS

| | | | |
|---|---|---|---|
| 6,638,607 B1 | 10/2003 | Curcio et al. | |
| 7,304,415 B2 | 12/2007 | Petersen et al. | |
| 8,242,665 B2 * | 8/2012 | Robinson | B06B 1/0622 310/334 |
| 8,547,799 B2 * | 10/2013 | Rhim | A61B 8/00 367/155 |
| 8,754,574 B2 | 6/2014 | Morris et al. | |
| 2005/0225210 A1 | 10/2005 | Englund et al. | |

(Continued)

OTHER PUBLICATIONS

Machine translation for Korean Application No. 10-1435011, Aug. 21, 2014.

(Continued)

*Primary Examiner* — J. San Martin

(57) ABSTRACT

An ultrasound transducer used in an ultrasound system and a manufacturing method thereof includes: a backing block; a piezoelectric layer placed on the backing block; a matching layer placed on the piezoelectric layer; and a ground layer placed between the piezoelectric layer and the matching layer. The backing layer includes a connector that connects a transmitting unit and a receiving unit of an ultrasound system, and a wiring area that connects the piezoelectric layer and the connector. The wiring area is formed by etching and filling with metal material.

6 Claims, 4 Drawing Sheets

(56) References Cited

U.S. PATENT DOCUMENTS

| | | |
|---|---|---|
| 2006/0035481 A1 | 2/2006 | Petersen et al. |
| 2009/0015101 A1 | 1/2009 | Petersen et al. |
| 2011/0248603 A1* | 10/2011 | Tezuka ................. A61B 8/4405 310/314 |
| 2011/0316389 A1* | 12/2011 | Kwon ................... B06B 1/0622 310/335 |
| 2015/0182194 A1 | 7/2015 | Bruestle et al. |
| 2015/0250452 A1* | 9/2015 | Jin ........................... A61B 8/14 310/334 |
| 2016/0271651 A1 | 9/2016 | Petersen et al. |

OTHER PUBLICATIONS

Machine translation for Korean Application No. 10-1397100, May 13, 2014.

* cited by examiner

ULTRASOUND TRANSDUCER AND MANUFACTURING METHOD THEREOF

RELATED CASE

This application claims the benefit of KR 2016-0094961, filed on Jul. 26, 2016, which is hereby incorporated by reference in its entirety.

TECHNICAL FIELD

The present disclosure provides an ultrasound transducer having a simple wiring structure and a manufacturing method thereof. The present disclosure relates to an ultrasound transducer used in an ultrasound system and manufacturing method thereof.

BACKGROUND ART

Ultrasound systems have been widely used in medical fields to obtain information on objects of interest in a target object. Using high-frequency sound waves, an ultrasound system can provide high-resolution images of the target object in real time without requiring an invasive surgical operation on the target object. Due to their non-invasive nature as well as non-destructive nature, ultrasound systems have been widely used in the medical field.

The ultrasound system comprises an ultrasound transducer for generating ultrasound signals and transmitting/receiving them. The ultrasound transducer comprises a piezoelectric layer made of piezoelectric ceramic material such as PZT (Lead Zirconate Titanate), etc. that generates ultrasound signals in response to electrical pulse signals, and transmits the ultrasound signals to a target object, receives echo signals reflected from the target object; transforms the reflected echo signals into electrical signals, and transmits the electrical signals to an ultrasound imaging device. Generally, the piezoelectric ceramic element of the ultrasound transducer is placed between a backing block and an acoustic matching layer.

The backing block is formed by a material having a similar impedance value to an acoustic impedance of the piezoelectric ceramic element and having a high damping coefficient. When the electrical pulse signals are applied to the piezoelectric ceramic element, the backing block allows for generation of short pulses of the ultrasound signals by quickly suppressing vibrations of the piezoelectric ceramic element. Further, the backing block works to decrease heat from the piezoelectric ceramic element, and absorbs the ultrasound signals from a back side of the piezoelectric ceramic element.

The acoustic matching layer is used to reduce energy loss by reflection of the ultrasound signals due to acoustic impedance difference between the piezoelectric ceramic element and the target object. The acoustic matching layer is made of a material having an impedance value corresponding to a value between the acoustic impedance of the piezoelectric ceramic element and the acoustic impedance of the target object.

Generally, since a Flexible Printed Circuit Board ("FPCB") for signals and a FPCB for ground are necessary to drive the piezoelectric layer, a wiring structure of the ultrasound transducer is complex.

SUMMARY

An ultrasound transducer according to one embodiment of the present disclosure includes: a backing block; a piezoelectric layer placed on the backing block; a matching layer placed on the piezoelectric layer; and a ground layer placed between the piezoelectric layer and the matching layer. The backing layer includes a connector that connects a transmitter (e.g., transmit beamformer) and a receiver (e.g., receive beamformer) of an ultrasound system and a wiring area that connects the piezoelectric layer and the connector.

Further, the backing block in the ultrasound transducer according to one embodiment of the present disclosure further includes a ground area for connecting with the ground layer.

Further, the ground layer in the ultrasound transducer according to one embodiment of the present disclosure is connected to the ground area by using a flexible printed circuit board.

Further, the wiring area in the ultrasound transducer according to one embodiment of the present disclosure is formed by being etched by laser processing and by being filled with metal material.

Further, the backing block in the ultrasound transducer according to one embodiment of the present disclosure includes a predetermined ratio of oxide of metal of at least one of Cr, Fe, and Cu.

Further, the predetermined ratio in the ultrasound transducer according to one embodiment of the present disclosure is in a range of more than 0% to less than 21%.

A method of manufacturing an ultrasound transducer according to one embodiment of the present disclosure includes: preparing a backing block comprising a predetermined ratio of oxide of metal of at least one of Cr, Fe, and Cu; forming a wiring area on at least one side of the backing block; placing a piezoelectric layer on the backing block; placing a ground layer on the piezoelectric layer; and placing a matching layer on the ground layer.

Further, forming the wiring area in the method of manufacturing an ultrasound transducer according to one embodiment of the present disclosure includes: etching the wiring area by laser processing; and filling a metal material in the wiring area. Wherein, the metal material includes at least one of Cu, Ni, and Au.

According to embodiments of the present disclosure, since it is possible to manufacture the wiring of the transducer with a simple structure, it is possible to achieve space and cost savings. Therefore, it becomes possible to increase ultrasound characteristics and electrical signal characteristics.

DETAILED DESCRIPTION OF THE DRAWINGS

Hereinafter, embodiments of the present disclosure will be described with reference to the accompanying drawings. The term "unit" used in these embodiments means a software component or hardware component, such as a field-programmable gate array (FPGA) and an application specific integrated circuit (ASIC). However, a "unit" is not limited to software and hardware, and may be configured to be in an addressable storage medium or may be configured to run on one or more processors. For example, a "unit" may include components, such as software components, object-oriented software components, class components, and task components, as well as processors, functions, attributes, procedures, subroutines, segments of program codes, drivers, firmware, micro-codes, circuits, data, databases, data structures, tables, arrays, and variables. Functions provided in components and "units" may be combined into a smaller number of components and "units" or further subdivided into additional components and "units."

Figure 1:
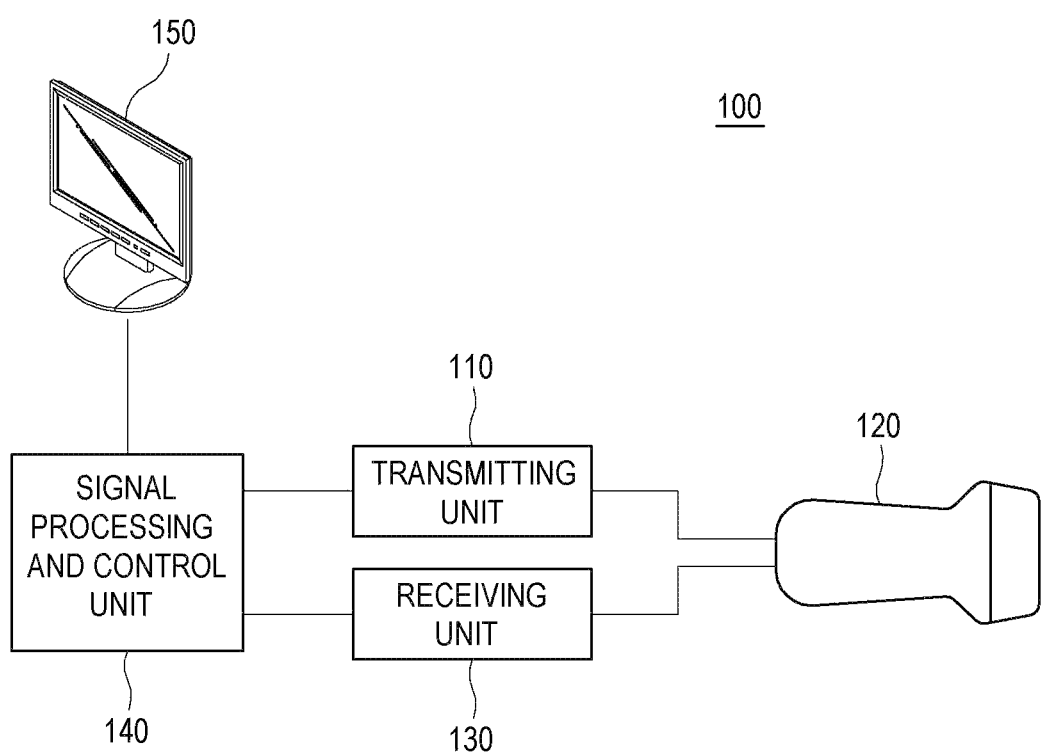
FIG. 1 is a block diagram schematically showing a configuration of an ultrasound system according to an embodiment of the present disclosure.

FIG. 1 is a block diagram schematically showing a configuration of an ultrasound system 100 according to an embodiment of the present disclosure.

As shown in FIG. 1, the ultrasound system 100 includes a transmitting unit 110 (e.g., transmit beamformer), an ultrasound transducer 120, a receiving unit 130 (e.g., receive beamformer), a signal processing and control unit 140 (e.g., image processor as hardware, detector, and/or a hardware controller), and a display unit 150 (e.g., display device).

The transmitting unit 110 transmits electrical pulse signals to the ultrasound transducer 120 while applying delays to the electrical pulse signals to make them have a predetermined transmitting pattern. The ultrasound transducer 120 includes an array of ultrasound transducers having a plurality of transducer elements in which a plurality of matching layers are stacked on piezoelectric ceramic elements. The ultrasound transducer 120 transmits ultrasound beams to a target object in response to the time-delayed electrical pulse signals that are transmitted from the transmitting unit 110. Further, the ultrasound transducer 120 receives echo signals reflected from the target object, transforms the echo signals into electrical signals, and outputs receive signals. The receiving unit 130 forms a receive-focused beam by applying delays to the receive signals outputted from the ultrasound transducer 120 in consideration of distances between each of the transducer elements of the ultrasound transducer 120 and focal points and summing the delayed receive signals. The signal processing and control unit 140 performs signal processing on the receive-focused beam and forms the ultrasound data. Further, the signal processing and control unit 140 controls operations of the transmitting unit 110, the ultrasound transducer 120, and the receiving unit 130. The display unit 150 displays ultrasound images of the target object based on the ultrasound data.

Figure 2:
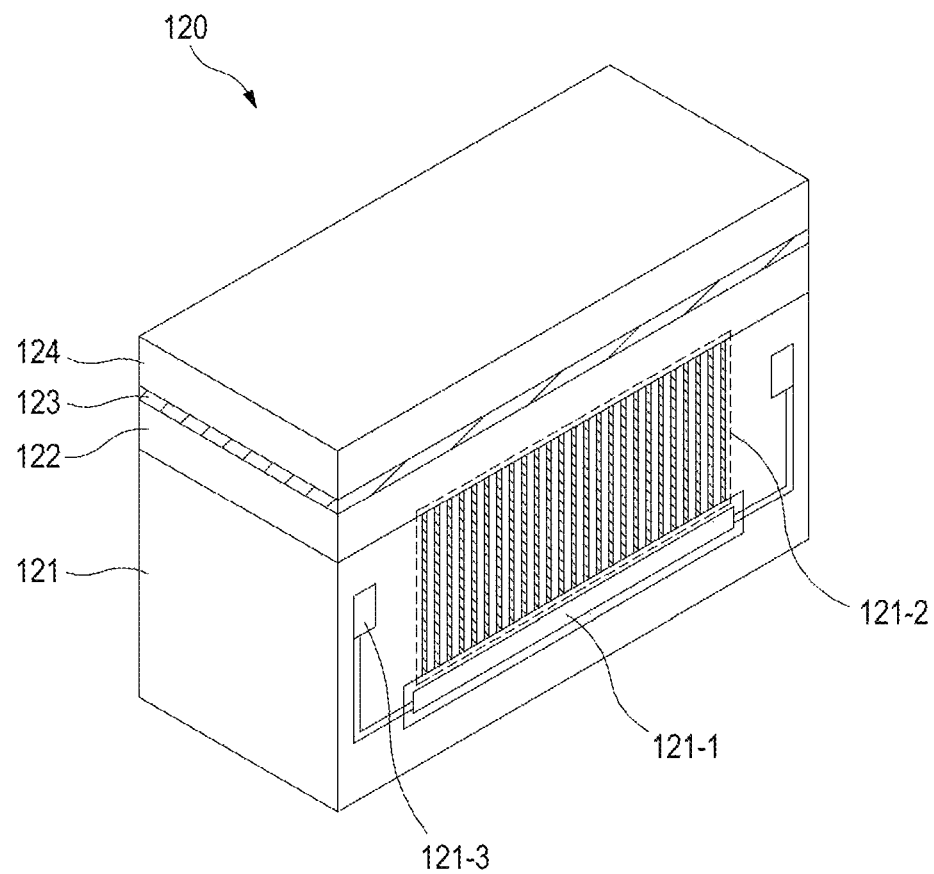
FIG. 2 is an illustrative view showing a configuration of an ultrasound transducer according to an embodiment of the present disclosure.

FIG. 2 is an illustrative view showing a configuration of an ultrasound transducer 120 according to an embodiment of the present disclosure.

As shown in FIG. 2, the ultrasound transducer 120 includes a backing block 121, a piezoelectric layer 122, a ground layer 123, and a matching layer 124. The backing block 121 may include a connector 121-1, a wiring area 121-2, and a ground area 121-3.

The piezoelectric layer 122 is made of piezoelectric ceramic materials such as Lead Zirconate Titanate ("PZT"), generates ultrasound signals in response to electrical pulse signals transmitted from the transmitting unit 110, receives echo signals reflected from the target object, and transforms the received echo signals into electrical signals.

The backing block 121 may be formed by mixing a material, e.g. polymer resin, having a similar impedance value to an acoustic impedance of the piezoelectric ceramic elements included in the piezoelectric layer 122 and having a high damping coefficient, and a predetermined ratio of oxide of metal of Cr, Fe, Cu, etc. Wherein, the predetermined ratio may be in a range of more than 0% to less than 21%; however, the ratio is not limited thereto. In the event that a backing block is made by only a material used in a general backing block, it may be difficult to perform laser processing on a surface of the backing block. However, if a backing block is made by mixing a material used in a general backing block and a predetermined ratio of oxide of metal of Cr, Fe, Cu, etc., it becomes possible to easily perform laser processing on a surface of the backing block 121.

In one embodiment, a surface of the backing block 121 is etched by laser processing; and the wiring area 121-2 may be formed by filling a metal material of one among a group of Cu, Ni, Au in the etched area of the surface of the backing block 121.

Further, the backing block 121 may include a connector 121-1 that electrically connects with the transmitting unit 110 and the receiving unit 130 of the ultrasound system 100. The wiring area 121-2 may electrically connect the piezoelectric layer 122 and the connector 121-1.

Further, the backing block 121 may include a ground area 121-3 for connecting with the ground layer 123. In one embodiment, the ground area 121-3 may be formed by etching on a surface of the backing block 121 by laser processing and by filling metal material of at least one of Cu, Ni, and Au on the etched surface of the backing block 121, similar to the formation method of the wiring area 121-2. In one embodiment, the ground area 121-3 and the ground layer 123 may be connected to each other by using the Flexible Printed Circuit Board (not shown).

Figure 3:
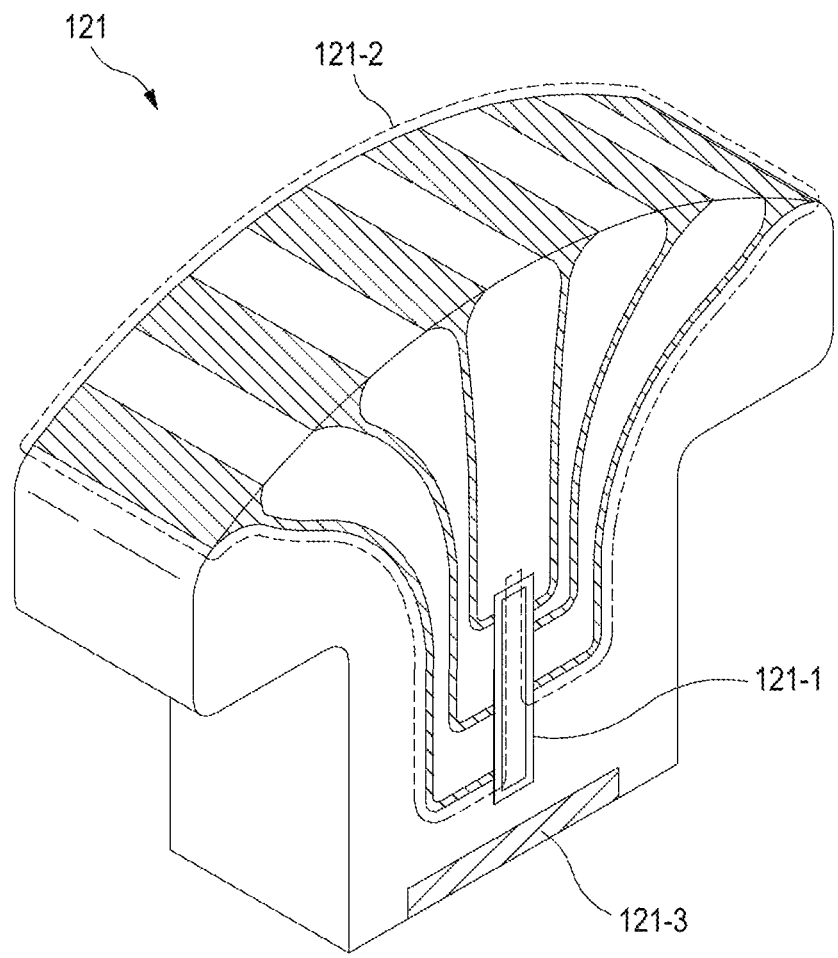
FIG. 3 is an illustrative view showing a configuration of a backing block of a convex type ultrasound transducer according to an embodiment of the present disclosure.

FIG. 3 is an illustrative view showing a configuration of a backing block of a convex type ultrasound transducer according to an embodiment of the present disclosure.

As shown in FIG. 3, each wiring included in the wiring area 121-2 may be extended to an upper side of the backing block 121 and may transmit/receive signals to/from the piezoelectric layer 122. Further, each wiring included in the wiring area 121-2 may be connected to the connector 121-1 and may transmit/receive signals to/from the ultrasound system 100. Further, a ground area 121-3 for connecting with the ground layer 123 may be formed in a lower portion of the backing block 121.

Figure 4:
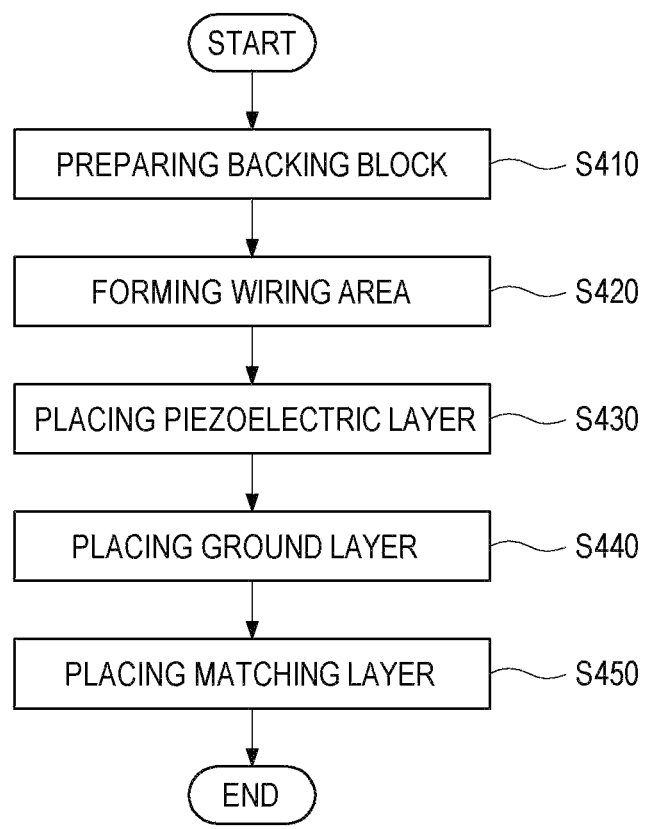
FIG. 4 is a flowchart showing a process for forming a wiring area in a backing area according to an embodiment of the present disclosure.

FIG. 4 is a flowchart showing a process for forming a wiring area 121-2 in a backing area 121 according to an embodiment of the present disclosure.

As shown in FIG. 4, the backing block 121 may be prepared by mixing a material used in a general backing block and a predetermined ratio of oxide of metal of at least one of Cr, Fe, and Cu (S410). In one embodiment, a material of the backing block 121 may be prepared by mixing a general backing material and the predetermined ratio of oxide of metal of at least one of Cr, Fe, and Cu; and the backing block 121 may be formed by the prepared material of the backing block 121 by using an injection molding method, however the method of making the backing block 121 is not limited thereto. Since the backing block 121 is prepared by mixing the general backing material and the predetermined ratio of oxide of metal of at least one of Cr, Fe, and Cu, it becomes possible to easily perform etching by using laser processing.

Hereinafter, the wiring area 121-2 may be formed by an etching method using laser processing on at least one side of the backing block 121 (S420). In one embodiment, a formation of the wiring area 121-2 may be performed by the Laser Direct Structuring method of LPKF Co. Ltd, however the method of forming the wiring area 121-2 is not limited thereto. Further, metal plating may be performed by filling a metal material of at least one of Cu, Ni, and Au in the wiring area 121-2 formed by the laser processing.

Hereinafter, the piezoelectric layer 122 may be placed on the backing block 121 (S430); the ground layer 123 may be placed on the piezoelectric layer 122 (S440); and the matching layer 124 may be placed on the ground layer 123 (S450), so that the ultrasound transducer 120 can be fabricated.

To decrease the pitch of the elements of the piezoelectric layer 122, the etching and filling is performed on more than one side of the backing block 121. For example, for elements with a pitch of 200 um, a continuous electrode (bus) is formed over the top surface of the backing block 121 facing the back of the piezoelectric element (i.e., on the surface for contact with the piezoelectric layer 122). Wire areas 121-2 for the elements are formed on opposite sides of the backing block 121. The etching is patterned so that different elements use different sides or wiring areas 121-2 (e.g., all the odd-numbered elements leave on the same side, and even-numbered elements leave on the opposite side). The continuous electrode is separated into individual element circuits during the dicing to form the elements in the piezoelectric layer 122, resulting in each element connecting with different conductors of the wiring areas 121-2 where some elements connect with conductors on one side of the backing block 121 and other elements connect with conductors on the other side of the backing block 121.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

We claim:

1. An ultrasound transducer comprising:
   a backing block;
   a piezoelectric layer placed on the backing block;
   a matching layer placed on the piezoelectric layer; and
   a ground layer placed between the piezoelectric layer and the matching layer,
   wherein the backing layer comprises a connector that connects to a transmitting unit and a receiving unit of an ultrasound system, and a wiring area that connects the piezoelectric layer and the connector, the wiring area comprising conductors filling etched portions of the backing material of the backing layer.

2. The ultrasound transducer of claim 1, wherein the backing block further comprises a ground area for connecting with the ground layer.

3. The ultrasound transducer of claim 2, wherein the ground layer is connected to the ground area by using a flexible printed circuit board.

4. The ultrasound transducer of claim 1, wherein the wiring area is formed by being etched by laser processing and by being filled with metal material as the conductors.

5. The ultrasound transducer of claim 1, wherein the backing block comprises a predetermined ratio of oxide of metal of at least one of Cr, Fe, and Cu.

6. The ultrasound transducer of claim 5, wherein the predetermined ratio is in a range of more than 0% to less than 21%.

* * * * *